United States Patent

[11] 3,602,777

[72] Inventor Herbert S. Berman
Pittsburgh, Pa.

[21] Appl. No. 30,481
[22] Filed Apr. 21, 1970
[45] Patented Aug. 31, 1971
[73] Assignee Westinghouse Electric Corporation
Pittsburgh, Pa.

[54] SILICON CARBIDE SEMICONDUCTOR DEVICE WITH HEAVILY DOPED SILICON CARBIDE OHMIC CONTACTS
4 Claims, 4 Drawing Figs.

[52] U.S. Cl. .......... 317/234 R, 317/235 R, 317/237, 317/234 M, 317/234 N, 317/235 N, 317/235 AP
[51] Int. Cl. .......... H01l 3/00, H01l 5/00
[50] Field of Search .......... 317/234, 5.3 M, 5.4 N, 235, 27 N, 483 AP, 237

[56] References Cited

UNITED STATES PATENTS

| | | | |
|---|---|---|---|
| 3,517,281 | 6/1970 | Mlavsky et al. .......... | 317/237 |
| 3,375,417 | 3/1968 | Hull, Jr. et al. .......... | 317/234 |

*Primary Examiner*—John W. Huckert
*Assistant Examiner*—B. Estrin
*Attorneys*—F. Shapoe and C. L. Menzemer

ABSTRACT: This disclosure relates to a semiconductor device comprised of a body of silicon carbide. The body of silicon carbide has at least two regions of opposite type semiconductivity with a pin junction between the regions of opposite type semiconductivity. An electrical contact consisting of silicon carbide is affixed to each region.

WITNESSES

*Wm. B. Sellers.*

*James F. Young*

INVENTOR

Herbert S. Berman

BY

*C. L. Menzemer*

ATTORNEY

SILICON CARBIDE SEMICONDUCTOR DEVICE WITH HEAVILY DOPED SILICON CARBIDE OHMIC CONTACTS

BACKGROUND OF THE INVENTION

1. Field of Invention

This invention is in the field of silicon carbide semiconductor devices.

2. Description Of The Prior Art

It is the current practice to make contact to a body of semiconductor material in a semiconductor device with electrical contacts consisting of a metal such for example as molybdenum, tungsten, tantalum or base alloys thereof. The device is then potted or encapsulated to protect at least the contacts from the adverse effects, such for example as heat and corrosion of the ambient.

It is an object of the present invention to provide a semiconductor device in which electrical contact is made to a body of semiconductor material with contacts consisting of the same material as the semiconductor body.

Other objects will, in part, be obvious and will, in part, appear hereinafter.

SUMMARY OF THE INVENTION

In accordance with the present invention and attainment of the foregoing objects there is provided a semiconductor device comprising a body of semiconductor material, said body having a region of a first type of semiconductivity, a region of a second type of semiconductivity and a PN junction between said regions of first and second type of semiconductivity, and an electrical contact affixed to each of the regions, said electrical contacts consisting of the same semiconductor material as the body.

BRIEF DESCRIPTION OF DRAWINGS

For a better understanding of the nature and objects of the invention, reference should be had to the following detailed description and drawing in which.

DESCRIPTION OF PREFERRED EMBODIMENT

For clarity of explanation, the invention will be described relative to a radiation, ultraviolet detector diode. However, the teachings are equally applicable to a power rectifier device.

Figure 1:
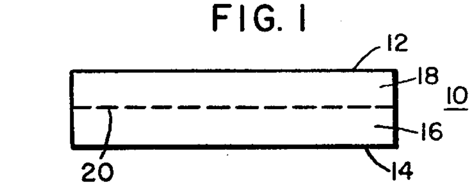
FIG. 1 is a side view, in cross section of a body of silicon carbide suitable for use in accordance with the teachings of this invention.

With reference to FIG. 1, there is shown a body 10 of silicon carbide. The body 10 may have been prepared by any of the methods known to those skilled in the art, as for example by either sublimation or isoepitaxial techniques.

The body 10 has a top surface 12 and a bottom surface 14. For purposes of this invention it is irrelevant which surface is the carbon surface and which is the silicon surface. However, in devices of this type the top surface 12 is usually the carbon surface. The thickness of the body preferably varies from 10 to 20 mils.

The body 10 has an N-type region 16 and a P-type region 18 with a PN junction 20 therebetween.

The N-type region 16 is doped with a suitable N-type dopant, as for example nitrogen to a concentration of from $10^{16}$ to $10^{17}$ atoms of nitrogen per cubic centimeter of silicon carbide. The P-type region 18 is doped with a suitable P-type dopant, as for example aluminum and boron to a concentration of from $10^{17}$ to $10^{18}$ atoms of dopant per cubic centimeter of silicon carbide. For the most satisfactory results, the doping concentration of the P-type region 18 should exceed the doping concentration of the N-type region 16 by at least an order of magnitude.

The thickness of the regions 16 and 18 depends on the total body thickness, preferably about 10 to 20 mils and the wavelength of radiation which is to be detected.

Figure 2:
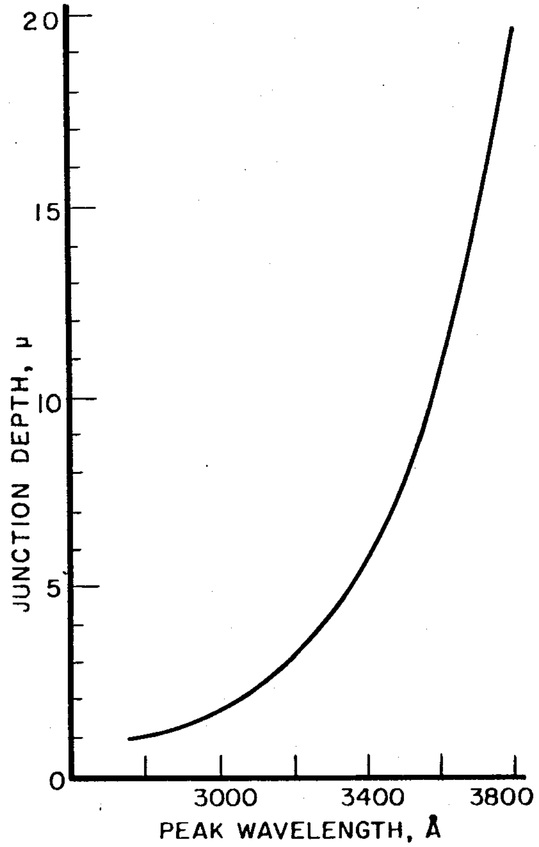
FIG. 2 is a graphical presentation of the relationship between junction depth and radiation response in a body as shown in FIG. 1.

FIG. 2 is a graphical presentation showing the relationship between PN junction depth in microns measured from the top surface 12, FIG. 1 to the PN junction, and peak wavelength response in angstroms. The thickness of the P-type region 18 can be controlled either during the initial formation of the region or by etching or lapping and etching after the P-type region is formed.

Figure 3:
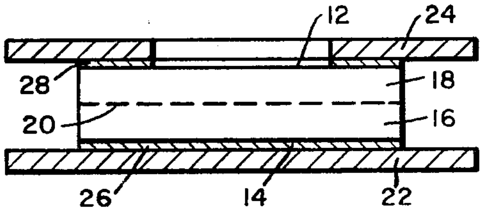
FIG. 3 is a side view, partially in section, of the body of FIG. 1 being processed in accordance with the teachings of this invention.

With reference to FIG. 3, a first electrical contact 22 is affixed to the bottom surface 14 of the body 10 and a second electrical contact 24 is affixed to the top surface 12 of the body 10. The electrical contacts 22 and 24 are affixed to the surfaces 12 and 14 respectively by solder layers 26 and 28 respectively.

The electrical contacts 22 and 24 consist of silicon carbide doped to a concentration of at least $10^{19}$ atoms of dopant per cubic centimeter of silicon carbide. The electrical contacts may be doped with either N-type dopants, as for example nitrogen or P-type dopants, as for example aluminum or boron. It is immaterial what type of dopant is used in doping the contact and a contact doped with either a P- or N-type dopant may be affixed to an N- or P-type region.

The solder comprising solder layers 26 and 28 consists of gold and one element selected from the group consisting of tantalum and nickel. The gold-tantalum solder consists of 94 percent, by weight, gold and 6 percent, by weight, tantalum. The gold-nickel solder is a gold-nickel eutectic consisting of approximately 60 percent, by weight, gold and 40 percent, by weight, nickel.

When using one of the two solders specified, the juncture between the contacts, either 22 or 24 and the body 10 has an impedance of less than $10^3$ to $10^4$ ohm while the PN junction 20 has an impedance of from about $10^7$ to $10^{10}$ ohms. This difference in impedance between the contact junctures and the PN junction explains why the semiconductivity type of the contacts is immaterial.

Figure 4:
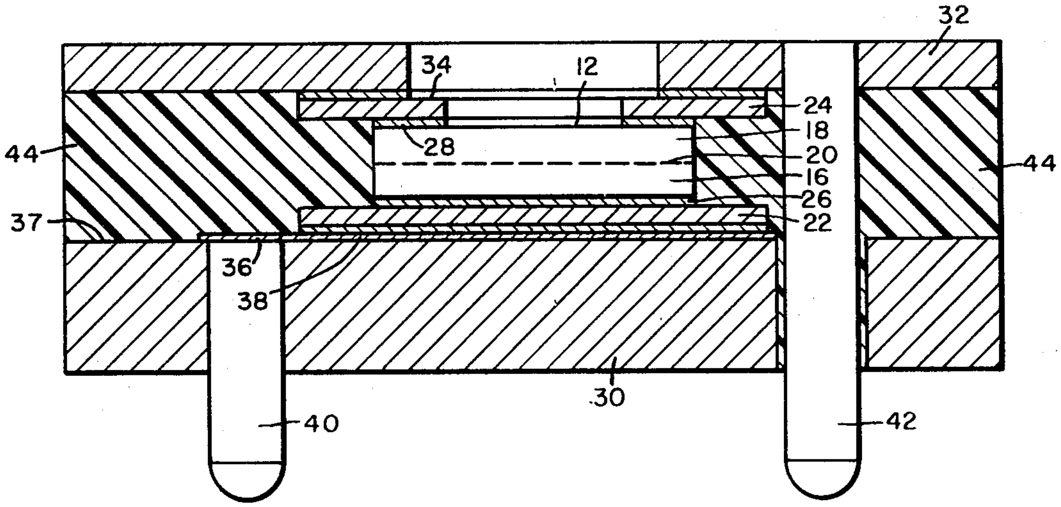
FIG. 4 is a side view, partially in section, of the device of this invention.

With reference to FIG. 4, the structure of FIG. 3 is then joined to metallized ceramic electrical leads 30 and 32. The lead 32, which may consist of any suitable metallized ceramic, such for example aluminum oxide ($Al_2O_3$) is soldered to top surface 34 of contact 24 with the same solder used to join the contacts 22 and 24 to the body 10.

Lead 30, which has a metallized layer 36 disposed on a portion of its top surface 37 of for example molybdenum, or nickel, is soldered to bottom surface 38 of contact 30 by the same solder as that used to solder the contact 22 to the body 10. The contact 22 is soldered to the metal layer 36.

Metal pinlike members 40 and 42, of for example nickel are joined to the leads 30 and 32 respectively to facilitate making electrical contact to the device.

A layer 44 of a resin as for example an epoxy or silicon resin or any suitable electrically insulating cement may be disposed about the periphery of the body 10 and contacts 22 and 24 and between leads 30 and 32 to provide rigidity and stability to the components.

In FIGS. 3 and 4, the top contact 24 is shown as a ring or annular shaped member. This configuration is in keeping with describing the device in terms of an ultraviolet detector device. The radiation being able to strike the region 18 in the area enclosed, but exposed, within the annular shaped member. If, however, the device is to be a power rectifier the contact 24 may be a solid member.

The device of FIG. 4 may be used in corrosive and high temperature ambients without any further encapsulation since silicon carbide is capable of withstanding such ambients.

I claim as my invention:

1. A semiconductor device comprising a body of silicon carbide, said body having a region of a first type of semiconductivity, a region of a second type of semiconductivity and a PN junction between said regions of first and second type of semiconductivity, an electrical contact of silicon carbide doped to a concentration of at least $10^{19}$ atoms of dopant per cubic centimeter in ohmic contact to each of the regions by means of a layer of solder composed of either 94 percent gold and 6 percent tantalum or 60 percent gold and 40 percent nickel.

2. The device of claim 1 in which electrical leads consisting of metallized ceramics are affixed to the silicon carbide electrical contacts.

3. The device of claim 2 in which the metallized ceramic leads are affixed to the silicon carbide electrical contacts by another layer of said solder.

4. The device of claim 1 in which one of the electrical contacts is annular in shape whereby a portion of one surface of the body of silicon carbide is exposed to ambient radiation.